United States Patent
Li et al.

(10) Patent No.: US 10,468,492 B2
(45) Date of Patent: Nov. 5, 2019

(54) THIN FILM TRANSISTOR, ARRAY SUBSTRATE AND DISPLAY APPARATUS HAVING THE SAME, AND FABRICATING METHOD THEREOF

(71) Applicant: BOE TECHNOLOGY GROUP CO., LTD., Beijing (CN)

(72) Inventors: Wei Li, Beijing (CN); Youngsuk Song, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 46 days.

(21) Appl. No.: 15/565,377

(22) PCT Filed: Oct. 12, 2016

(86) PCT No.: PCT/CN2016/101872
§ 371 (c)(1),
(2) Date: Oct. 9, 2017

(87) PCT Pub. No.: WO2018/068221
PCT Pub. Date: Apr. 19, 2008

(65) Prior Publication Data
US 2018/0308948 A1    Oct. 25, 2018

(51) Int. Cl.
*H01L 27/14* (2006.01)
*H01L 29/49* (2006.01)
(Continued)

(52) U.S. Cl.
CPC ........ *H01L 29/4908* (2013.01); *G03F 7/0035* (2013.01); *G03F 7/038* (2013.01); *G03F 7/0755* (2013.01); *G03F 7/0757* (2013.01); *G03F 7/094* (2013.01); *G03F 7/16* (2013.01); *G03F 7/20* (2013.01); *G03F 7/26* (2013.01); *H01L 21/28158* (2013.01); *H01L 29/42384* (2013.01); *H01L 29/51* (2013.01); *H01L 2029/42388* (2013.01)

(58) Field of Classification Search
CPC ........... H01L 29/4908; H01L 21/28158; H01L 29/42384; H01L 29/51; H01L 29/66757
USPC ........................................... 257/59, 72, 432
See application file for complete search history.

(56) References Cited

U.S. PATENT DOCUMENTS

| | | | |
|---|---|---|---|
| 8,835,909 B2 * | 9/2014 | Han | C23C 16/401 257/40 |
| 2006/0006380 A1 | 1/2006 | Shin et al. | |
| 2007/0259473 A1 * | 11/2007 | Wu | H01L 51/052 438/82 |

FOREIGN PATENT DOCUMENTS

| | | | |
|---|---|---|---|
| CN | 102746331 | * | 10/2012 |
| CN | 103050626 A | | 4/2013 |
| JP | 2012209528 A | | 10/2012 |

OTHER PUBLICATIONS

International Search Report & Written Opinion dated Jul. 21, 2017, regarding PCT/CN2016/101872.

* cited by examiner

*Primary Examiner* — Tan N Tran
(74) *Attorney, Agent, or Firm* — Intellectual Valley Law, P.C.

(57) ABSTRACT

The present application discloses a thin film transistor including a base substrate; an active layer on the base substrate comprising a channel region, a source electrode contact region, and a drain electrode contact region; a gate insulating layer on a side of the channel region distal to the base substrate; and a gate electrode on a side of the gate insulating layer distal to the channel region; the gate insulating layer being made of a silicone-based organic material.

20 Claims, 5 Drawing Sheets

(51) Int. Cl.
*H01L 29/423* (2006.01)
*G03F 7/00* (2006.01)
*G03F 7/038* (2006.01)
*G03F 7/075* (2006.01)
*G03F 7/09* (2006.01)
*G03F 7/16* (2006.01)
*G03F 7/20* (2006.01)
*G03F 7/26* (2006.01)
*H01L 21/28* (2006.01)
*H01L 29/51* (2006.01)

THIN FILM TRANSISTOR, ARRAY SUBSTRATE AND DISPLAY APPARATUS HAVING THE SAME, AND FABRICATING METHOD THEREOF

CROSS-REFERENCE TO RELATED APPLICATION

This application is a national stage application under 35 U.S.C. § 371 of International Application No. PCT/CN2016/101872, filed Oct. 12, 2016, the contents of which are incorporated by reference in the entirety.

TECHNICAL FIELD

The present invention relates to display technology, more particularly, to a thin film transistor; an array substrate, a display panel, and a display apparatus having the same, and a fabricating method thereof.

BACKGROUND

Display devices such as liquid crystal display (LCD) and organic light-emitting diode (OLED) have been widely used. LCD and OLED display devices use thin film transistor (TFT) to control pixels in the display panel. Examples of TFT include amorphous silicon TFT, polycrystalline silicon TFT, single crystal silicon TFT, and metal oxide TFT. A thin film transistor may be classified into a top gate type or a bottom gate type.

SUMMARY

In one aspect, the present invention provides a thin film transistor comprising a base substrate; an active layer on the base substrate comprising a channel region, a source electrode contact region, and a drain electrode contact region; a gate insulating layer on a side of the channel region distal to the base substrate; and a gate electrode on a side of the gate insulating layer distal to the channel region; wherein the gate insulating layer is made of a silicone-based organic material.

Optionally, boundaries between the source electrode contact region and the channel region and between the drain electrode contact region and the channel region substantially align with edges of the gate insulating layer and the gate electrode.

Optionally, a projection of the gate electrode on the base substrate substantially overlaps with that of the channel region, and the projection of the gate electrode on the base substrate and that of the channel region are substantially coextensive with each other.

Optionally, the active layer comprises a first metal sub-layer and a second metal sub-layer on a side distal to the base substrate; projections of the first metal sub-layer and the source electrode contact region on the base substrate are substantially coextensive with each other, and projections of the second metal sub-layer and the drain electrode contact region on the base substrate are substantially coextensive with each other.

Optionally, the gate insulating layer has a first portion having a thickness which decreases along a first direction from the channel region towards the source electrode contact region, a second portion having a thickness which decreases along a second direction from the channel region towards the drain electrode contact region, and a third portion between the first portion and the second portion having a substantially constant thickness.

Optionally, the gate insulating layer has a substantially inverted trapezoidal shape; a short base of the inverted trapezoidal shape is on a side of the gate electrode layer proximal to the channel region.

Optionally, the gate insulating layer has a thickness in a range of approximately 2.0 μm to approximately 2.5 μm.

Optionally, the silicone-based organic material has a structure of formula I:

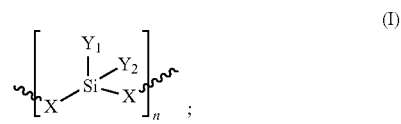

n is a positive integer; X is oxygen or carbon; and each of $Y_1$ and $Y_2$ is selected from the group consisting of a hydrogen atom, an alkyl group, a hydroxyl group, an alkoxyl group, an aryl group, an acryloyl group, a glycidyl group, a vinyl group, a-$OR_1$ group, and a

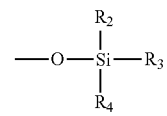

group; wherein $R_1$ is selected from the group consisting of a hydrogen atom, an alkyl group, and an aryl group, each of $R_2$, $R_3$, and $R_4$ is selected from the group consisting of a hydrogen atom, a hydroxyl group, an alkyl group, an aryl group, an alkoxyl group, a halogen atom, an acryloyl group, a glycidyl group, a vinyl group, a phenyl group, and a trialkylsiloxy group.

Optionally, the silicone-based organic material has a structure of formula II:

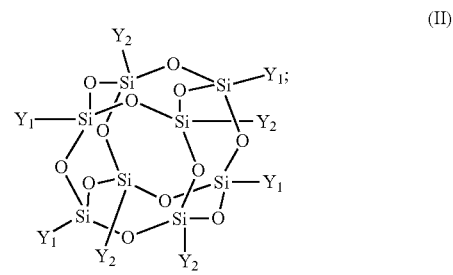

each of $Y_1$ and $Y_2$ is selected from the group consisting of a hydrogen atom, an alkyl group, a hydroxyl group, an alkoxyl group, an aryl group, an acryloyl group, a glycidyl group, a vinyl group, a-$OR_1$ group, and a

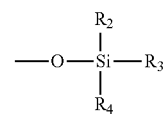

group; wherein $R_1$ is selected from the group consisting of a hydrogen atom, an alkyl group, and an aryl group, each of $R_2$, $R_3$, and $R_4$ is selected from the group consisting of a hydrogen atom, a hydroxyl group, an alkyl group, an aryl group, an alkoxyl group, a halogen atom, an acryloyl group, a glycidyl group, a vinyl group, a phenyl group, and a trialkylsiloxy group.

Optionally, thin film transistor further comprises an insulating layer on a side of the gate electrode and the active layer distal to the base substrate; a source via and a drain via extending through the insulating layer; a source electrode and a drain electrode on a side of the insulating layer distal to the base substrate; wherein the source electrode is electrically connected to the source electrode contact region through the source via, and the drain electrode is electrically connected to the drain electrode contact region through the drain via.

In another aspect, the present invention provides a method of fabricating a thin film transistor comprising forming an active layer on a base substrate, the active layer comprising a channel region, a source electrode contact region, and a drain electrode contact region; forming a gate insulating layer on a side of the channel region distal to the base substrate; and forming a gate electrode on a side of the gate insulating layer distal to the channel region; wherein the gate insulating layer is formed using a silicone-based organic material.

Optionally, the step of forming the active layer comprises forming a first metal sub-layer and a second metal sub-layer on a side distal to the base substrate; projections of the first metal sub-layer and the source electrode contact region on the base substrate are substantially coextensive with each other; and projections of the second metal sub-layer and the drain electrode contact region on the base substrate are substantially coextensive with each other.

Optionally, the step of forming the gate insulating layer comprises forming a first photoresist layer comprising the silicone-based organic material on a side of the active layer distal to the base substrate; the first photoresist layer is a negative photoresist layer, exposing the negative photoresist layer with a first mask plate thereby creating exposed portions and unexposed portions of the first photoresist layer; and developing the exposed first photoresist layer to remove the unexposed portions of the first photoresist layer, thereby obtaining a pattern corresponding to the gate insulating layer.

Optionally, the step of forming the first metal sub-layer, the second metal sub-layer, and the gate electrode is performed in a single process comprising forming a second photoresist layer comprising a second photoresist material on a side of the gate insulating layer and the active layer distal to the base substrate; exposing the second photoresist layer with a second mask plate; developing the exposed second photoresist layer to obtain a photoresist pattern comprising a first section corresponding to the gate insulating layer and the active layer, and a second section which is outside the first section; the second photoresist material is removed in the first section; depositing a conductive material layer on a side of the gate insulating layer, the active layer, and the second photoresist layer distal to the base substrate; and removing the second photoresist layer and the conductive material layer in the second section, thereby forming the first metal sub-layer, the second metal sub-layer, and the gate electrode.

Optionally, the step of removing the second photoresist layer and the conductive material layer in the second section is performed by a lift-off method using a lift-off solvent.

Optionally, the method further comprises forming an insulating layer on a side of the gate electrode and the active layer distal to the base substrate; forming a source via and a drain via extending through the insulating layer; and forming a source electrode and a drain electrode on a side of the insulating layer distal to the base substrate; wherein the source electrode is formed to be electrically connected to the source electrode contact region through the source via, and the drain electrode is formed to be electrically connected to the drain electrode contact region through the drain via.

Optionally, the gate electrode and the active layer are formed so that a projection of the gate electrode on the base substrate substantially overlaps with that of the channel region; and the projection of the gate electrode on the base substrate and that of the channel region are substantially coextensive with each other.

Optionally, the gate insulating layer is formed to have a first portion having a thickness which decreases along a first direction from the channel region towards the source electrode contact region, a second portion having a thickness which decreases along a second direction from the channel region towards the drain electrode contact region, and a third portion between the first portion and the second portion having a substantially constant thickness.

Optionally, the gate insulating layer is formed to have a substantially inverted trapezoidal shape; and a short base of the inverted trapezoidal shape is on a side of the gate electrode layer proximal to the channel region.

Optionally, the first photoresist layer comprises a silicone-based organic material having a structure of formula I:

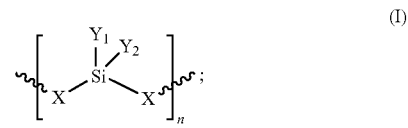

n is a positive integer; X is oxygen or carbon; and each of $Y_1$ and $Y_2$ is selected from the group consisting of a hydrogen atom, an alkyl group, a hydroxyl group, an alkoxyl group, an aryl group, an acryloyl group, a glycidyl group, a vinyl group, a-$OR_1$ group, and a

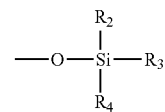

group; wherein $R_1$ is selected from the group consisting of a hydrogen atom, an alkyl group, and an aryl group, each of $R_2$, $R_3$, and $R_4$ is selected from the group consisting of a hydrogen atom, a hydroxyl group, an alkyl group, an aryl group, an alkoxyl group, a halogen atom, an acryloyl group, a glycidyl group, a vinyl group, a phenyl group, and a trialkylsiloxy group.

Optionally, the silicone-based organic material having a structure of formula I is covalently modified with a photosensitive functional group.

Optionally, the first photoresist layer comprises a silicone-based organic material having a structure of formula II:

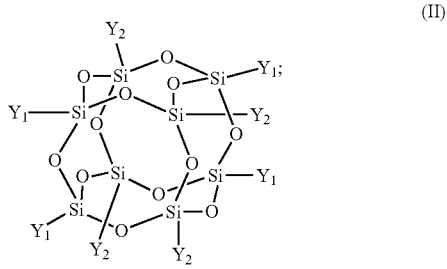 (II)

each of $Y_1$ and $Y_2$ is selected from the group consisting of a hydrogen atom, an alkyl group, a hydroxyl group, an alkoxyl group, an aryl group, an acryloyl group, a glycidyl group, a vinyl group, a-$OR_1$ group, and a

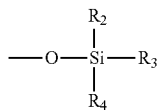

group; wherein $R_1$ is selected from the group consisting of a hydrogen atom, an alkyl group, and an aryl group, each of $R_2$, $R_3$, and $R_4$ is selected from the group consisting of a hydrogen atom, a hydroxyl group, an alkyl group, an aryl group, an alkoxyl group, a halogen atom, an acryloyl group, a glycidyl group, a vinyl group, a phenyl group, and a trialkylsiloxy group.

Optionally, the silicone-based organic material having a structure of formula II is covalently modified with a photosensitive functional group.

In another aspect, the present invention provides an array substrate comprising a thin film transistor described herein or fabricated by a method described herein.

In another aspect, the present invention provides a display panel comprising an array substrate described herein.

In another aspect, the present invention provides a display apparatus comprising a display panel described herein.

BRIEF DESCRIPTION OF THE FIGURES

The following drawings are merely examples for illustrative purposes according to various disclosed embodiments and are not intended to limit the scope of the present invention.

DETAILED DESCRIPTION

The disclosure will now be described more specifically with reference to the following embodiments. It is to be noted that the following descriptions of some embodiments are presented herein for purpose of illustration and description only. It is not intended to be exhaustive or to be limited to the precise form disclosed.

Figure 1:
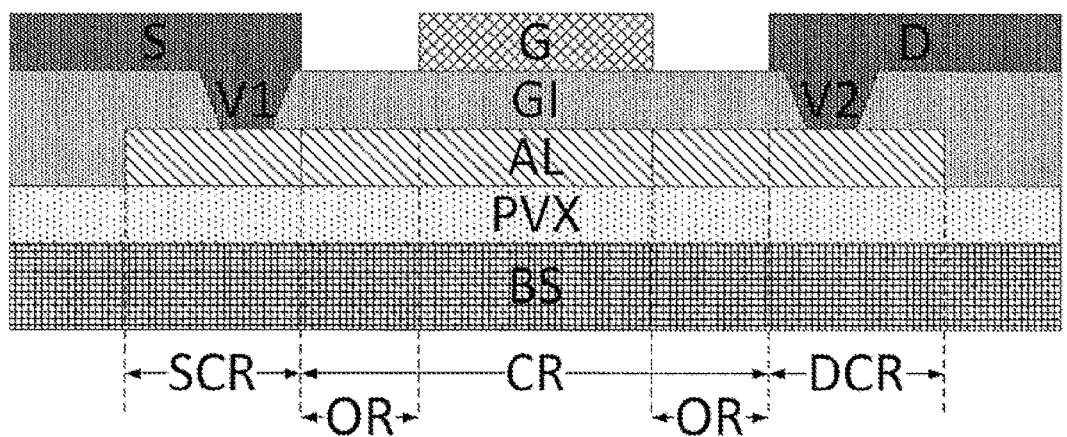
FIG. 1 is a diagram illustrating the structure of a conventional thin film transistor.

FIG. 1 is a diagram illustrating the structure of a conventional thin film transistor. Referring to FIG. 1, the thin film transistor is a conventional top gate type thin film transistor. The conventional top gate type thin film transistor includes a base substrate BS, a passivation layer PVX on the base substrate BS, an active layer AL on a side of the passivation layer PVX distal to the base substrate BS, a gate insulating layer GI on a side of the active layer AL distal to the passivation layer PVX, a gate electrode G, a source electrode S, and a drain electrode D on a side of the gate insulating layer GI distal to the active layer, and a first via V1 and a second via V2 extending through the gate insulating layer GI, the source electrode S being electrically connected to the active layer AL through the first via V1, and the drain electrode D being electrically connected to the active layer AL through the second via V2. The active layer AL includes a source electrode contact region SCR, a drain electrode contact region DCR, and a channel region CR between the source electrode contact region SCR and the drain electrode contact regions DCR.

Typically, the gate electrode G, the source electrode S, and the drain electrode D is formed by first depositing a metal layer on the gate insulating layer GI, followed by depositing a photoresist layer on the metal layer. The metal layer is patterned using a mask plate on the photoresist layer. e.g., by forming a photoresist pattern corresponding to the source electrode S, the drain electrode D, and the gate electrode G, and etching the underlying metal layer with a wet etching. Due to the critical dimension bias during the wet etching process, the gate electrode is typically formed to be smaller than the channel region CR. As such, the active layer AL includes two offset regions OR on two sides of the channel region CR. The existence of offset regions OR in a top gate type thin film transistor results in a higher on/off current ratio and a decreased current during the "on" period of the thin film transistor because the offset regions OR is in direct contact with and adjacent to the source electrode contact region SCR. Another issue with the top gate type thin film transistor is associated with contact resistance at contact regions between the active layer AL and the source S and drain D electrodes.

Accordingly, the present invention provides, inter alia, a thin film transistor; an array substrate, a display panel, and a display apparatus having the same, and a fabricating method thereof that substantially obviate one or more of the problems due to limitations and disadvantages of the related art. In one aspect, the present disclosure provides a thin film transistor substantially free of offset regions. In some embodiments, the thin film transistor includes a base substrate; an active layer on the base substrate comprising a channel region, a source electrode contact region, and a drain electrode contact region; a gate insulating layer on a side of the channel region distal to the base substrate; and a gate electrode on a side of the gate insulating layer distal to the channel region. Optionally, the gate insulating layer in the present thin film transistor is made of a silicone-based organic material. Optionally, the silicone-based organic material is a silicone-based organic material made from a silicone-based curable organic material (e.g., an ultraviolet curable composite). Optionally, the silicone-based organic material is a silicone-based organic material made from a silicone-based photocurable resin material.

Figure 2:
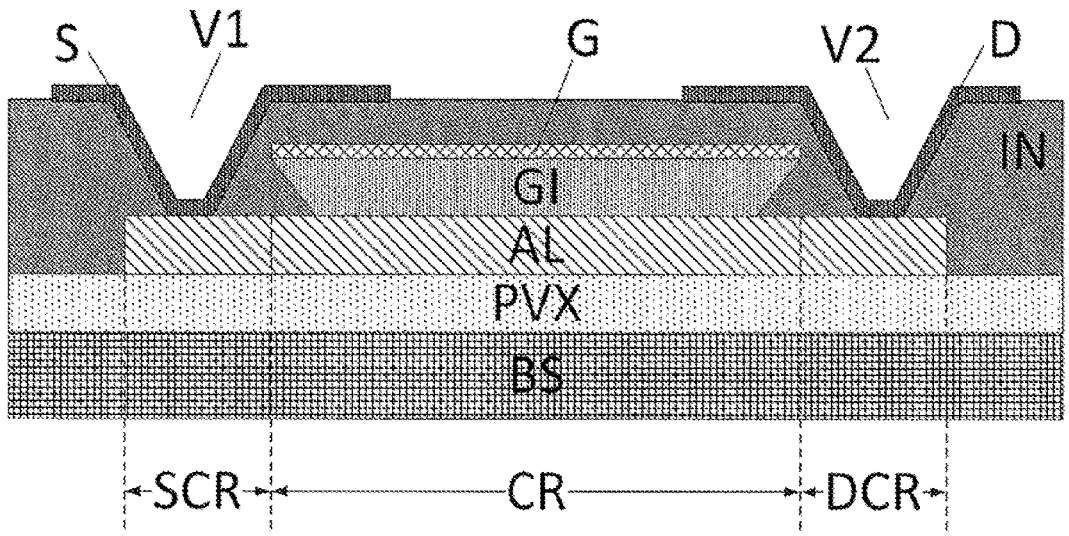
FIG. 2 is a diagram illustrating the structure of a thin film transistor in some embodiment according to the present disclosure.

FIG. 2 is a diagram illustrating the structure of a thin film transistor in some embodiment according to the present disclosure. Referring to FIG. 2, the thin film transistor in the embodiment includes a base substrate BS, a passivation layer PVX on the base substrate BS, an active layer AL on a side of the passivation layer PVX distal to the base substrate BS. The active layer AL in the present thin film transistor includes a source electrode contact region SCR, a drain electrode contact region DCR, and a channel region CR between the source electrode contact region SCR and the drain electrode contact region DCR. As shown in FIG. 2, the thin film transistor further includes a gate insulating layer GI on a side of the channel region CR distal to the base substrate BS, and a gate electrode G on a side of the gate insulating layer GI distal to the channel region CR.

In some embodiments, the present top gate type thin film transistor is substantially free of offset regions, thus achieving much improved electrical characteristics as compared to conventional top gate type thin film transistors. Referring to FIG. 2, a boundary between the source electrode contact region SCR and the channel region CR substantially align with a first edge of the gate electrode G. Optionally, the boundary between the source electrode contact region SCR and the channel region CR also substantially align with a first edge of the gate insulating layer GI. Similarly, a boundary between the drain electrode contact region DCR and the channel region CR substantially align with a second edge of the gate electrode G. Optionally, the boundary between the drain electrode contact region DCR and the channel region CR also substantially align with a second edge of the gate insulating layer GI. Optionally, the first edge and the second edge of the gate electrode G are on two opposite sides of the gate electrode G. Optionally, the first edge and the second edge of the gate insulating layer GI are on two opposite sides of the gate insulating layer GI.

In some embodiments, a width of the gate electrode G along a direction from the source electrode contact region SCR to the drain electrode contact region DCR is substantially the same as that of the channel region CR. Optionally, a width of the gate insulating layer GI along a direction from the source electrode contact region SCR to the drain electrode contact region DCR is substantially the same as that of the channel region CR.

In some embodiments, a projection of the gate electrode G on the base substrate BS substantially overlaps with that of the channel region CR. Optionally, the projection of the gate electrode G on the base substrate BS and that of the channel region CR are substantially coextensive with each other, i.e., the area of the gate electrode G is substantially the same as that of the channel region.

In some embodiments, a projection of the gate insulating layer GI on the base substrate BS substantially overlaps with that of the channel region CR. Optionally, the projection of the gate insulating layer GI on the base substrate BS and that of the channel region CR are substantially coextensive with each other, i.e., the area of the gate insulating layer GI is substantially the same as that of the channel region CR.

Figure 3:
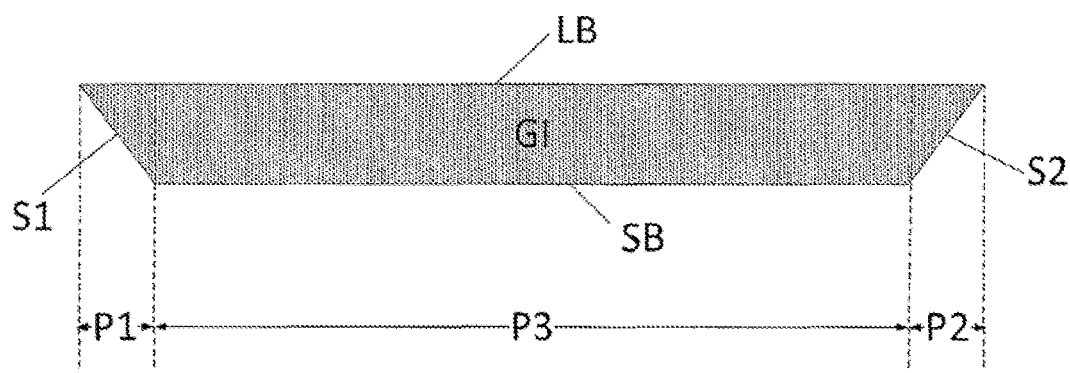
FIG. 3 is a diagram illustrating the structure of a gate insulating layer in some embodiment according to the present disclosure.

The gate insulating layer GI may be made of any appropriate shape and dimension. Examples of appropriate shapes include a rectangular shape, a trapezoidal shape, and an inverted trapezoidal shape. FIG. 3 is a diagram illustrating the structure of a gate insulating layer in some embodiment according to the present disclosure. Referring to FIG. 3, the gate insulating layer GI in the embodiment has a first portion P1, a second portion P2, and a third portion P3. The first portion P1 has a thickness which decreases along a first direction from the channel region CR towards the source electrode contact region SCR. The second portion P2 has a thickness which decreases along a second direction from the channel region CR towards the drain electrode contact region DCR. The third portion P3 is between the first portion P1 and the second portion P2. The third portion P3 has a substantially constant thickness.

Referring to FIG. 3, the gate insulating layer GI has a long base LB on a side of the channel region CR proximal to the gate electrode G, and a short base SB on a side of the gate electrode layer G proximal to the channel region CR. In some embodiments, a width of the long base LB along a direction from the source electrode contact region SCR to the drain electrode contact region DCR is substantially the same as that of the channel region CR.

Referring to FIG. 3, the gate insulating layer GI has two sides, a first side S1 and a second side S2. Optionally, the first side S1 and the second side S2 are straight lines. Optionally, the first side S1 and the second side S2 are curved lines. Optionally, the first side S1 and the second side S2 have a same length. Optionally, the gate insulating layer GI has a substantially inverted trapezoidal shape; and the short base SB of the inverted trapezoidal shape is on a side of the gate electrode layer G proximal to the channel region CR. Optionally, the gate insulating layer has an overall thickness in a range of approximately 2.0 µm to approximately 2.5 µm. Optionally, the third portion P3 of the gate insulating layer has an overall thickness in a range of approximately 2.0 µm to approximately 2.5 µm.

Optionally, the gate insulating layer has a substantially trapezoidal shape; and a long base of the trapezoidal shape is on a side of the gate electrode layer proximal to the channel region. Optionally, the gate insulating layer has a substantially rectangular shape.

Figure 4:
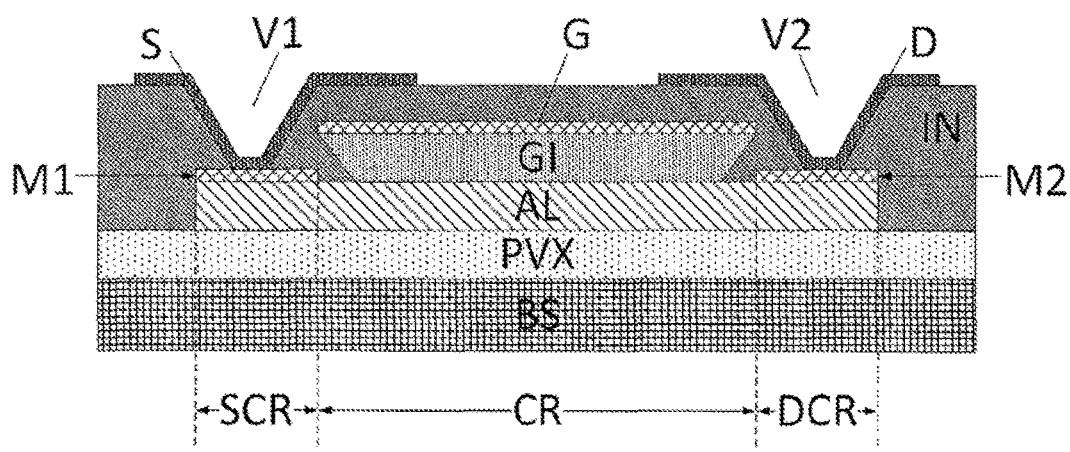
FIG. 4 is a diagram illustrating the structure of a thin film transistor in some embodiment according to the present disclosure.

FIG. 4 is a diagram illustrating the structure of a thin film transistor in some embodiment according to the present disclosure. Referring to FIG. 4, the active layer AL of the thin film transistor in the embodiment includes a first metal sub-layer M1 and a second metal sub-layer M2 on a side distal to the base substrate BS. The first metal sub-layer M1 is in the source electrode contact region SCR, and the second metal sub-layer M2 is in the drain electrode contact region DCR. Optionally, projections of the first metal sub-layer M1 and the source electrode contact region SCR on the base substrate BS are substantially coextensive with each other. Optionally, projections of the second metal sub-layer M2 and the drain electrode contact region DCR on the base substrate BS are substantially coextensive with each other. By having a first metal sub-layer M1 and the second metal sub-layer M2, the contact resistance of the active layer AL in the source electrode contact region SCR and the drain electrode contact region DCR may be significantly reduced, further improving the electrical characteristics of the thin film transistor.

Referring to FIG. 2 and FIG. 4, the thin film transistors in these embodiments further includes an insulating layer IN on a side of the gate electrode G and the active layer AL distal to the base substrate BS; a source via V1 and a drain via V2 extending through the insulating layer IN; a source electrode S and a drain electrode D on a side of the insulating layer IN distal to the base substrate BS. The source electrode S is electrically connected to the source electrode contact region SCR of the active layer AL through the source via V1. The drain electrode D is electrically connected to the drain electrode contact region DCR of the active layer AL through the drain via V2.

Referring to FIG. 4, the thin film transistors in these embodiments further includes an insulating layer IN on a side of the gate electrode G and the active layer AL distal to the base substrate BS; a source via V1 and a drain via V2 each extending through the insulating layer IN; a source electrode S and a drain electrode D on a side of the insulating layer IN distal to the base substrate BS. The source electrode S is electrically connected to the first metal sub-layer M1 in the source electrode contact region SCR through the source via V1. The drain electrode D is electrically connected to the second metal sub-layer M2 in the drain electrode contact region DCR through the drain via V2.

Various appropriate silicone-based organic materials may be use for making the gate insulating layer. Optionally, the gate insulating layer is made from a silicone-based curable organic material (e.g., an ultraviolet curable composite). Optionally, the silicone-based organic material is a silicone-based resin material. Optionally, the gate insulating layer is made from a silicone-based photocurable resin material. Examples of appropriate silicone-based organic materials include, but are not limited to, silsesquioxane or a linear polymeric silicone compound. Examples of silsesquioxanes include, but are not limited to, a cage silsesquioxane, a partial cage silsesquioxane, a ladder silsesquioxane, and a silsesquioxane having a random structure. Examples of linear polymeric silicone compounds include, but are not limited to, polysiloxane and polycarbosilane.

In some embodiments, the silicone-based organic material has a structure of formula I:

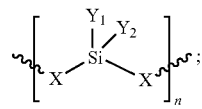

(I)

wherein n is a positive integer; X is oxygen or carbon. In some embodiments, each of $Y_1$ and $Y_2$ is selected from the group consisting of a hydrogen atom, an alkyl group, a hydroxyl group, an alkoxyl group, an aryl group, an acryloyl group, a glycidyl group, a vinyl group, a-$OR_1$ group, and a

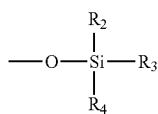

group; wherein R1 is selected from the group consisting of a hydrogen atom, an alkyl group, and an aryl group, each of $R_2$, $R_3$, and $R_4$ is selected from the group consisting of a hydrogen atom, a hydroxyl group, an alkyl group, an aryl group, an alkoxyl group, a halogen atom, an acryloyl group, a glycidyl group, a vinyl group, a phenyl group, and a trialkylsiloxy group. Optionally, n is in a range of 1 to 1000, e.g., 1 to 500, 1 to 200, 1 to 100, 1 to 50, or 1 to 20.

In some embodiments, one of $Y_1$ and $Y_2$ is a photosensitive functional group, and the other is selected from the group consisting of a hydrogen atom, an alkyl group, a hydroxyl group, an alkoxyl group, an aryl group, a-$OR_1$ group, and a

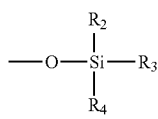

group. Optionally, $R_1$ is selected from the group consisting of a hydrogen atom, an alkyl group, and an aryl group, each of $R_2$, $R_3$, and $R_4$ is selected from the group consisting of a hydrogen atom, a hydroxyl group, an alkyl group, an aryl group, an alkoxyl group, a halogen atom, an acryloyl group, a glycidyl group, a vinyl group, a phenyl group, and a trialkylsiloxy group. In some embodiment, one of $Y_1$ and $Y_2$ is selected from the group consisting of a hydrogen atom, an alkyl group, a hydroxyl group, an alkoxyl group, an aryl group, a-$OR_1$ group, and a

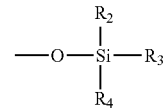

group; and the other is selected from the group consisting of an alkyl group, a hydroxyl group, an alkoxyl group, an aryl group, a-$OR_1$ group, and a

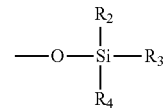

group, and further covalently modified by a photosensitive functional group. Optionally, $R_1$ is selected from the group consisting of a hydrogen atom, an alkyl group, and an aryl group, each of $R_2$, $R_3$, and $R_4$ is selected from the group consisting of a hydrogen atom, a hydroxyl group, an alkyl group, an aryl group, an alkoxyl group, a halogen atom, an acryloyl group, a glycidyl group, a vinyl group, a phenyl group, and a trialkylsiloxy group. Optionally, an unreacted photosensitive functional group is a functional group that renders the silicone-based organic material a negative photoresist. Optionally, an unreacted photosensitive functional group is a functional group that renders the silicone-based organic material a positive photoresist. Optionally, the photosensitive functional group is

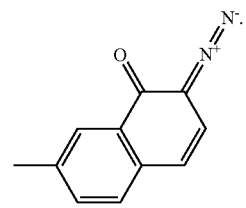

Optionally, the photosensitive functional group is

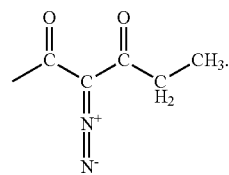

Optionally, the photosensitive functional group is a group having one or more epoxy groups. Optionally, the photosensitive functional group is a group having one or more polymerizable double bond.

In some embodiments, the silicone-based organic material has a structure of formula II:

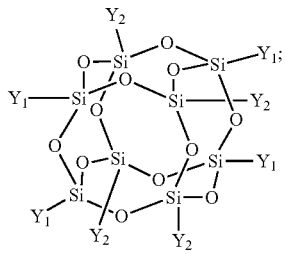

(II)

In some embodiments, each of $Y_1$ and $Y_2$ is selected from the group consisting of a hydrogen atom, an alkyl group, a hydroxyl group, an alkoxyl group, an aryl group, a-$OR_1$ group, and a

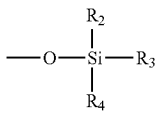

group; wherein $R_1$ is selected from the group consisting of a hydrogen atom, an alkyl group, and an aryl group, each of $R_2$, $R_3$, and $R_4$ is selected from the group consisting of a hydrogen atom, a hydroxyl group, an alkyl group, an aryl group, an alkoxyl group, a halogen atom, an acryloyl group, a glycidyl group, a vinyl group, a phenyl group, and a trialkylsiloxy group.

In some embodiments, one of $Y_1$ and $Y_2$ is a photosensitive functional group, and the other is selected from the group consisting of a hydrogen atom, an alkyl group, a hydroxyl group, an alkoxyl group, an aryl group, a-$OR_1$ group, and a

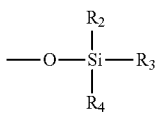

group. Optionally, $R_1$ is selected from the group consisting of a hydrogen atom, an alkyl group, and an aryl group, each of $R_2$, $R_3$, and $R_4$ is selected from the group consisting of a hydrogen atom, a hydroxyl group, an alkyl group, an aryl group, an alkoxyl group, a halogen atom, an acryloyl group, a glycidyl group, a vinyl group, a phenyl group, and a trialkylsiloxy group. In some embodiment, one of $Y_1$ and $Y_2$ is selected from the group consisting of a hydrogen atom, an alkyl group, a hydroxyl group, an alkoxyl group, an aryl group, a-$OR_1$ group, and a

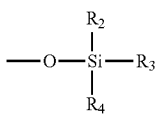

group; and the other is selected from the group consisting of an alkyl group, a hydroxyl group, an alkoxyl group, an aryl group, a-$OR_1$ group, and a

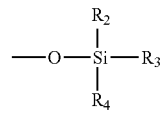

group, and further covalently modified by a photosensitive functional group. Optionally, $R_1$ is selected from the group consisting of a hydrogen atom, an alkyl group, and an aryl group, each of $R_2$, $R_3$, and $R_4$ is selected from the group consisting of a hydrogen atom, a hydroxyl group, an alkyl group, an aryl group, an alkoxyl group, a halogen atom, an acryloyl group, a glycidyl group, a vinyl group, a phenyl group, and a trialkylsiloxy group. Optionally, an unreacted photosensitive functional group is a functional group that renders the silicone-based organic material a negative photoresist. Optionally, an unreacted photosensitive functional group is a functional group that renders the silicone-based organic material a positive photoresist. Optionally, the photosensitive functional group is

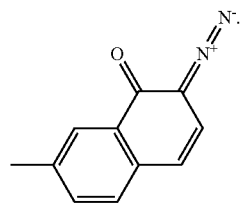

Optionally, the photosensitive functional group is

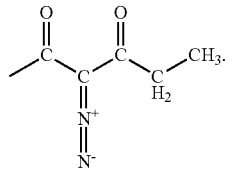

Optionally, the photosensitive functional group is a group having one or more epoxy groups. Optionally, the photosensitive functional group is a group having one or more polymerizable double bond.

In another aspect, the present disclosure provides a method of fabricating a thin film transistor. In some embodiments, the method includes forming an active layer on a base substrate, the active layer comprising a channel region, a source electrode contact region, and a drain electrode contact region; forming a gate insulating layer on a side of the channel region distal to the base substrate; and forming a gate electrode on a side of the gate insulating layer distal to the channel region. Optionally, the gate insulating layer is formed using a silicone-based organic material.

In some embodiments, a top gate type thin film transistor fabricated by the present method is substantially free of offset regions, thus achieving much improved electrical characteristics. In some embodiments, the thin film transistor is fabricated so that a boundary between the source electrode contact region and the channel region substantially align with a first edge of and the gate electrode. Optionally, the thin film transistor is fabricated so that the boundary between the source electrode contact region and the channel region also substantially align with a first edge of and the gate insulating layer. Optionally, the thin film transistor is fabricated so that a boundary between the drain electrode contact region and the channel region substantially align with a second edge of the gate electrode. Optionally, the thin film transistor is fabricated so that the boundary between the drain electrode contact region and the channel region also substantially align with a second edge of the gate insulating layer.

In some embodiments, the thin film transistor is fabricated so that a width of the gate electrode along a direction from the source electrode contact region to the drain electrode contact region is substantially the same as that of the channel region. Optionally, the thin film transistor is fabricated so that a width of the gate insulating layer along a direction from the source electrode contact region to the drain electrode contact region is substantially the same as that of the channel region.

In some embodiments, the thin film transistor is fabricated so that a projection of the gate electrode on the base substrate substantially overlaps with that of the channel region. Optionally, the thin film transistor is fabricated so that the projection of the gate electrode on the base substrate and that of the channel region are substantially coextensive with each other, i.e., the area of the gate electrode is substantially the same as that of the channel region.

In some embodiments, the thin film transistor is fabricated so that a projection of the gate insulating layer on the base substrate substantially overlaps with that of the channel region. Optionally, the thin film transistor is fabricated so that the projection of the gate insulating layer on the base substrate and that of the channel region are substantially coextensive with each other, i.e., the area of the gate insulating layer is substantially the same as that of the channel region.

In some embodiments, the method further includes forming an insulating layer on a side of the gate electrode and the active layer distal to the base substrate; forming a source via and a drain via extending through the insulating layer; and forming a source electrode and a drain electrode on a side of the insulating layer distal to the base substrate. The source electrode is formed to be electrically connected to the source electrode contact region through the source via. The drain electrode is formed to be electrically connected to the drain electrode contact region through the drain via. Optionally, the source electrode is formed to be electrically connected to the first metal sub-layer in the source electrode contact region through the source via. Optionally, the drain electrode is electrically connected to the second metal sub-layer in the drain electrode contact region through the drain via.

The gate insulating layer may be formed to have any appropriate shape (e.g., a rectangular shape, a trapezoidal shape, and an inverted trapezoidal shape) and dimension. Optionally, the gate insulating layer is formed to have a substantially inverted trapezoidal shape; and the short base of the inverted trapezoidal shape is on a side of the gate electrode layer proximal to the channel region.

In some embodiments, the step of forming the active layer includes forming a first metal sub-layer in the source electrode contact region and a second metal sub-layer in the drain electrode contact region on a side distal to the base substrate. Optionally, the first metal sub-layer and a second metal sub-layer are formed so that projections of the first metal sub-layer and the source electrode contact region on the base substrate are substantially coextensive with each other, and projections of the second metal sub-layer and the drain electrode contact region on the base substrate are substantially coextensive with each other. By forming a first metal sub-layer in the source electrode contact region and the second metal sub-layer in the drain electrode contact region, the contact resistance of the active layer in the source electrode contact region and the drain electrode contact region may be significantly reduced, further improving the electrical characteristics of the thin film transistor.

Figure 5A:
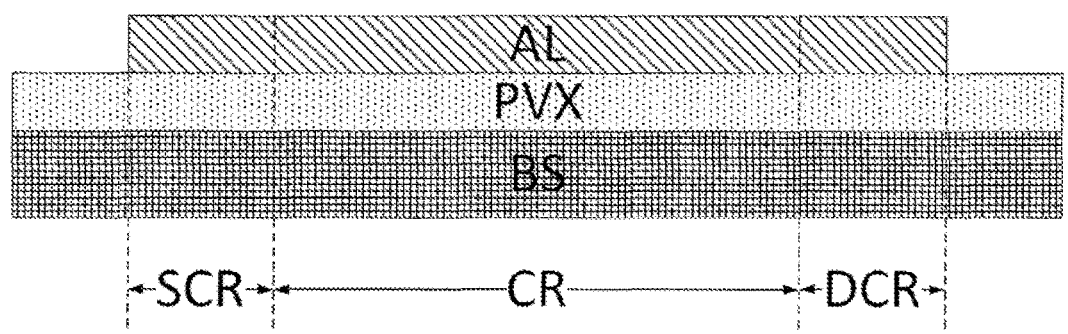
FIGS. 5A-5E illustrate a process of fabricating a thin film transistor in some embodiment according to the present disclosure.

FIGS. 5A-5E illustrate a process of fabricating a thin film transistor in some embodiment according to the present disclosure. Referring to FIG. 5A, the method includes forming an active layer AL on a base substrate BS, the active layer AL has a source electrode contact region SCR, a drain electrode contact region DCR, and a channel region CR between the source electrode contact region SCR and the drain electrode contact region DCR.

Figure 5B:
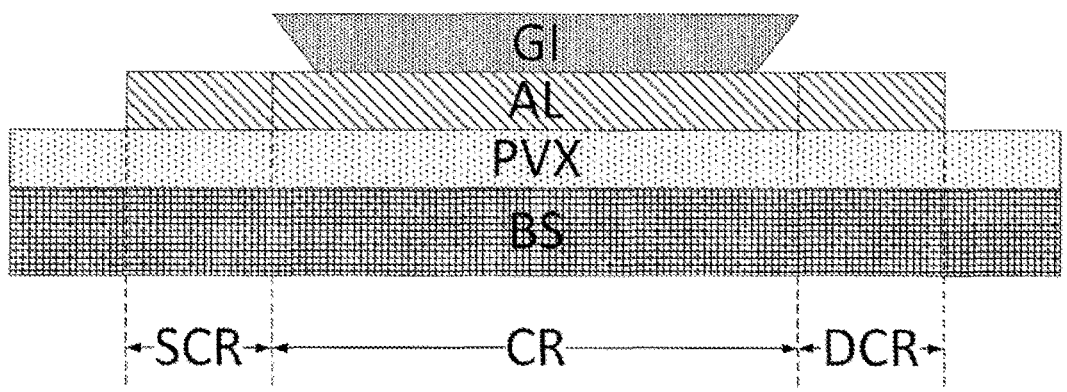

Referring to FIG. 5B, the method includes a step of forming a gate insulating layer GI including a silicone-based organic material on a side of the active layer AL distal to the base substrate BS. Optionally, the material for forming the gate insulating layer GI is a photoresist material including the silicone-based organic material, e.g., a negative photoresist material including the silicone-based organic material. Optionally, the step of forming the gate insulating layer GI includes forming a first photoresist layer including the silicone-based organic material on a side of the active layer AL distal to the base substrate BS. The first photoresist layer is a negative photoresist layer, e.g., the portions of the photoresist layer being exposed remain on the base substrate. Typically, a photoresist pattern obtained from a negative photoresist has an undercut profile, e.g., an inverted trapezoidal shape.

The negative photoresist layer is then exposed with a mask plate, creating exposed portions and unexposed portions of the negative photoresist layer. The negative photoresist layer is then developed to remove the unexposed portions of the negative photoresist layer. The exposed portions of the negative photoresist layer remain. The remaining photoresist layer is then baked, thereby obtaining a photoresist pattern corresponding to the gate insulating layer GI. As shown in FIG. 5B, the gate insulating layer GI formed according to the step above has a substantially inverted trapezoidal shape, suitable for performing subsequent lift-off procedure for forming a gate electrode, a first metal layer, and a second metal layer.

Figure 5C:
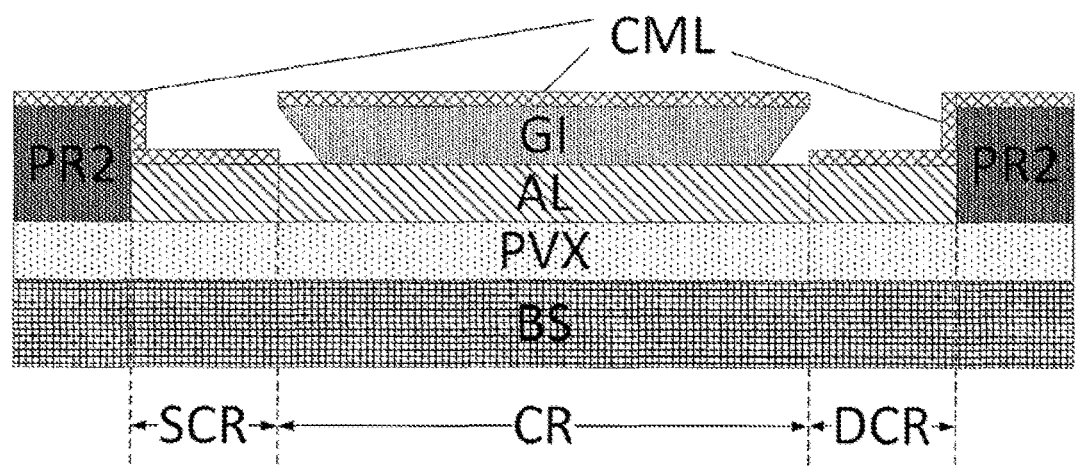

Referring to FIG. 5C, the method further includes forming a conductive material layer CML on a side of the gate insulating layer GI and the active layer AL distal to the base substrate BS. Specifically, the method includes forming a second photoresist layer PR2 having a second photoresist material on a side of the gate insulating layer GI and the active layer AL distal to the base substrate BS; exposing the second photoresist layer PR2 with a second mask plate; developing the exposed second photoresist layer PR2 to obtain a photoresist pattern having a first section corresponding to the gate insulating layer GI and the active layer AL, and a second section which is outside the first section; the second photoresist material is removed in the first section (as shown in FIG. 5C). A conductive material is then deposited in the first section and the second section, e.g., on a side of the second photoresist layer PR2 in the second section, the source electrode contact region SCR, and the gate insulating layer GI distal to the base substrate BS, thereby forming a conductive material layer CML.

Figure 5D:
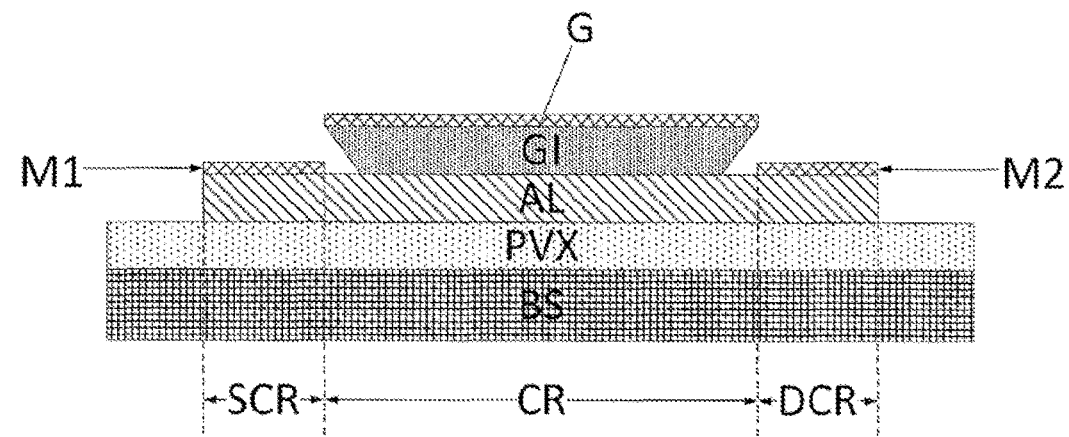

Referring to FIG. 5D, the method further includes removing the second photoresist layer PR2 and the conductive material layer CML in the second section, thereby forming the first metal sub-layer M1, the second metal sub-layer M2, and the gate electrode G. Optionally, the second photoresist layer PR2 and the conductive material layer CML in the second section is removed by a lift-off method. For example, the second photoresist layer PR2 and the conductive material layer CML in the second section may be removed by a lift-off solvent. Examples of appropriate lift-off solvent include, but are not limited to, N-methylpyrrolidone (NMP).

Figure 5E:
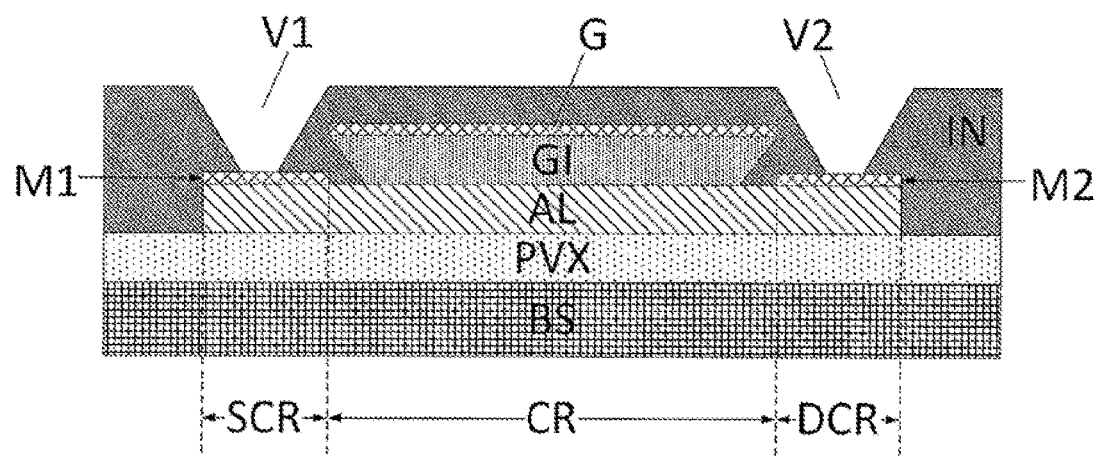

Referring to FIG. 5E, the method further includes forming an insulating layer IN on a side of the gate electrode G and the active layer AL distal to the base substrate BS; and forming a source via V1 and a drain via V2 extending through the insulating layer IN. Referring to FIG. 4, the method further includes forming a source electrode S and a drain electrode D on a side of the insulating layer IN distal to the base substrate BS. The source electrode S is formed to be electrically connected to the source electrode contact region SCR through the source via V1. The drain electrode D is formed to be electrically connected to the drain electrode contact region DCR through the drain via V2.

In some embodiments, the second photoresist layer PR2 is not removed in the source electrode contact region SCR and the drain electrode contact region DCR. As a result, the thin film transistor so formed will not include a first metal sub-layer and a second metal sub-layer (e.g., the thin film transistor as shown in FIG. 2).

In some embodiments, the gate insulating layer is made by a photoresist material including the silicone-based organic material. Optionally, the gate insulating layer is made from a silicone-based curable organic material (e.g., an ultraviolet curable composite). Optionally, the gate insulating layer is made from a silicone-based curable resin material. Optionally, the gate insulating layer is made from a silicone-based photocurable resin material. Optionally, the photoresist material is a positive photoresist material. Optionally, the photoresist material is a negative photoresist material. Optionally, the photoresist material is a mixture of the silicone-based organic material and a photoresist agent. Optionally, the silicone-based organic material itself is a photoresist material. Optionally, the photoresist material is a functionalized silicone-based organic material, e.g., a silicone-based organic material covalently modified with a photosensitive functional group. Examples of appropriate silicone-based organic materials suitable for making the mixture or making the functionalized silicone-based organic material include, but are not limited to, silsesquioxane or a linear polymeric silicone compound. Examples of silsesquioxanes include, but are not limited to, a cage silsesquioxane, a partial cage silsesquioxane, a ladder silsesquioxane, and a silsesquioxane having a random structure. Examples of linear polymeric silicone compounds include, but are not limited to, polysiloxane and polycarbosilane.

In some embodiments, the photoresist material is a mixture of the silicone-based organic material and a positive photoresist material such as quinonediazide and novolak resin. In some embodiments, the photoresist material is a silicone-based organic material covalently modified with a photosensitive functional group having positive photoresist properties. Examples of such functional groups include, but are not limited to,

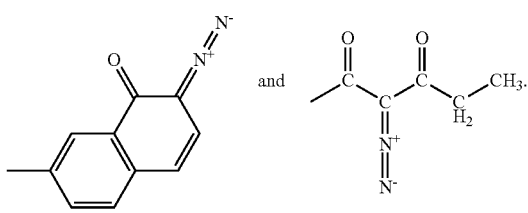

In some embodiments, the photoresist material is a mixture of the silicone-based organic material and a negative photoresist material such as SU-8 and KTFR resist. In some embodiments, the photoresist material is a silicone-based organic material covalently modified with a photosensitive functional group having negative photoresist properties. Examples of such functional groups include, but are not limited to, one or more epoxy groups and a functional group having one or more polymerizable double bond. When exposed, the silicone-based organic material is cross-linked by the negative photoresist material in the mixture or by the photosensitive functional group.

Various appropriate electrode materials and various appropriate fabricating methods may be used to make the gate electrode, the first metal sub-layer, and the second metal sub-layer. For example, an electrode material may be deposited on the substrate, e.g., by sputtering or vapor deposition or solution coating; and patterned. Examples of appropriate electrode materials for making the gate electrode, the first metal sub-layer, and the second metal sub-layer include, but are not limited to, aluminum, molybdenum, aluminum Neodymium (AlNd), copper, molybdenum Niobium (MoNb), and alloys thereof.

Various appropriate electrode materials and various appropriate fabricating methods may be used to make the source electrode and the drain electrode. For example, an electrode material may be deposited on the substrate, e.g., by sputtering or vapor deposition or solution coating; and patterned. Examples of appropriate electrode materials for making the source electrode and the drain electrode include, but are not limited to, aluminum, molybdenum, aluminum Neodymium (AlNd), copper, molybdenum Niobium (MoNb), and alloys thereof.

Various appropriate semiconductor materials and various appropriate fabricating methods may be used to make the active layer. For example, a semiconductor material may be deposited on the substrate by a plasma-enhanced chemical vapor deposition (PECVD) process. Examples of appropriate semiconductor materials for making the active layer includes, but are not limited to, metal oxides (e.g., ITO, IZTO, IGTO), amorphous silicon, polycrystalline silicon, etc.

Various appropriate insulating materials and various appropriate fabricating methods may be used to make the insulating layer. For example, an insulating material may be deposited on the substrate by a plasma-enhanced chemical vapor deposition (PECVD) process. Examples of appropriate insulating materials for making the insulating layer include, but are not limited to, silicon oxide ($SiO_y$), silicon nitride ($SiN_y$, e.g., $Si_3N_4$), silicon oxynitride ($SiO_xN_y$), and polyimide.

In another aspect, the present disclosure provides an array substrate having a thin film transistor described herein or fabricated by a method described herein.

In another aspect, the present disclosure provides a display panel having an array substrate described herein.

In another aspect, the present disclosure provides a display apparatus having a display panel described herein. Examples of appropriate display apparatuses includes, but are not limited to, an electronic paper, a mobile phone, a tablet computer, a television, a monitor, a notebook computer, a digital album, a GPS, etc.

The foregoing description of the embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like does not necessarily limit the claim scope to a specific embodiment, and the reference to exemplary embodiments of the invention does not imply a limitation on the invention, and no such limitation is to be inferred. The invention is limited only by the spirit and scope of the appended claims. Moreover, these claims may refer to use "first", "second", etc. following with noun or element. Such terms should be understood as a nomenclature and should not be construed as giving the limitation on the number of the elements modified by such nomenclature unless specific number has been given. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. A thin film transistor, comprising:
   a base substrate;
   an active layer on the base substrate comprising a channel region, a source electrode contact region, and a drain electrode contact region;
   a gate insulating layer on a side of the channel region away from the base substrate; and
   a gate electrode on a side of the gate insulating layer away from the channel region;
   wherein the gate insulating layer is made of a silicone-based organic material;
   the gate insulating layer has a first side in contact with the active layer and a second side in contact with the gate electrode;
   the first side has a first width along a direction from the source electrode contact region to the drain electrode contact region;
   the second side has a second width along the direction from the source electrode contact region to the drain electrode contact region; and
   the second width is greater than the first width.

2. The thin film transistor of claim 1, wherein the channel region has a third width along the direction from the source electrode contact region to the drain electrode contact region; and
   the third width is the same as the second width.

3. The thin film transistor of claim 1, wherein the gate electrode has a fourth width along the direction from the source electrode contact region to the drain electrode contact region; and
   the fourth width is the same as the second width.

4. The thin film transistor of claim 1, wherein the active layer comprises a first metal sub-layer and a second metal sub-layer on a side away from the base substrate;
   the first metal sub-layer has a fifth width along the direction from the source electrode contact region to the drain electrode contact region;
   the source electrode contact part has a sixth width along the direction from the source electrode contact region to the drain electrode contact region;
   the second metal sub-layer has a seventh width along the direction from the source electrode contact region to the drain electrode contact region;
   the drain electrode contact part has an eighth width along the direction from the source electrode contact region to the drain electrode contact region;
   the fifth width is the same as the sixth width; and
   the seventh width is the same as the eighth width.

5. The thin film transistor of claim 1, wherein the gate insulating layer has a first portion having a thickness which decreases along a first direction from the channel region towards the source electrode contact region, a second portion having a thickness which decreases along a second direction from the channel region towards the drain electrode contact region, and a third portion between the first portion and the second portion having a constant thickness.

6. The thin film transistor of claim 5, wherein the gate insulating layer has an inverted trapezoidal shape; a short base of the inverted trapezoidal shape is on a side of the gate electrode layer closer to the channel region.

7. The thin film transistor of claim 1, wherein the gate insulating layer has a thickness in a range of approximately 2.0 μm to approximately 2.5 μm.

8. The thin film transistor of claim 1, wherein the silicone-based organic material has a structure of formula I:

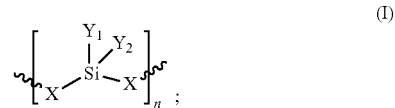

n is a positive integer; X is oxygen or carbon; and each of $Y_1$ and $Y_2$ is selected from the group consisting of a hydrogen atom, an alkyl group, a hydroxyl group, an alkoxyl group, an aryl group, an acryloyl group, a glycidyl group, a vinyl group, a-$OR_1$ group, and a

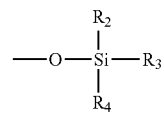

group; wherein $R_1$ is selected from the group consisting of a hydrogen atom, an alkyl group, and an aryl group, each of $R_2$, $R_3$, and $R_4$ is selected from the group consisting of a hydrogen atom, a hydroxyl group, an alkyl group, an aryl group, an alkoxyl group, a halogen atom, an acryloyl group, a glycidyl group, a vinyl group, a phenyl group, and a trialkylsiloxy group.

9. The thin film transistor of claim 1, wherein the silicone-based organic material has a structure of formula II:

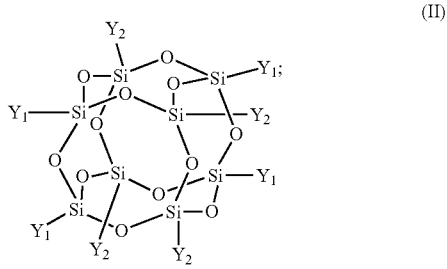

(II)

each of $Y_1$ and $Y_2$ is selected from the group consisting of a hydrogen atom, an alkyl group, a hydroxyl group, an alkoxyl group, an aryl group, an acryloyl group, a glycidyl group, a vinyl group, a-$OR_1$ group, and a

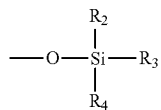

group; wherein $R_1$ is selected from the group consisting of a hydrogen atom, an alkyl group, and an aryl group, each of $R_2$, $R_3$, and $R_4$ is selected from the group consisting of a hydrogen atom, a hydroxyl group, an alkyl group, an aryl group, an alkoxyl group, a halogen atom, an acryloyl group, a glycidyl group, a vinyl group, a phenyl group, and a trialkylsiloxy group.

10. A display panel, comprising a thin film transistor of claim 1.

11. A method of fabricating a thin film transistor, comprising:
forming an active layer on a base substrate, the active layer comprising a channel region, a source electrode contact region, and a drain electrode contact region;
forming a gate insulating layer on a side of the channel region away from the base substrate; and
forming a gate electrode on a side of the gate insulating layer away from the channel region;
wherein the gate insulating layer is formed using a silicone-based organic material;
the gate insulating layer has a first side in contact with the active layer and a second side in contact with the gate electrode;
the first side has a first width along a direction from the source electrode contact region to the drain electrode contact region;
the second side has a second width along the direction from the source electrode contact region to the drain electrode contact region; and
the second width is greater than the first width.

12. The method of claim 11, wherein the step of forming the active layer comprises forming a first metal sub-layer and a second metal sub-layer on a side away from the base substrate;
the first metal sub-layer has a fifth width along the direction from the source electrode contact region to the drain electrode contact region;
the source electrode contact part has a sixth width along the direction from the source electrode contact region to the drain electrode contact region;
the second metal sub-layer has a seventh width along the direction from the source electrode contact region to the drain electrode contact region;
the drain electrode contact part has an eighth width along the direction from the source electrode contact region to the drain electrode contact region;
the fifth width is the same as the sixth width; and
the seventh width is the same as the eighth width.

13. The method of claim 12, wherein the step of forming the gate insulating layer comprises forming a first photoresist layer comprising the silicone-based organic material on a side of the active layer away from the base substrate; the first photoresist layer is a negative photoresist layer;
exposing the negative photoresist layer with a first mask plate thereby creating exposed portions and unexposed portions of the first photoresist layer; and
developing the exposed first photoresist layer to remove the unexposed portions of the first photoresist layer, thereby obtaining a pattern corresponding to the gate insulating layer.

14. The method of claim 13, wherein the step of forming the first metal sub-layer, the second metal sub-layer, and the gate electrode is performed in a single process comprising:
forming a second photoresist layer comprising a second photoresist material on a side of the gate insulating layer and the active layer away from the base substrate;
exposing the second photoresist layer with a second mask plate;
developing the exposed second photoresist layer to obtain a photoresist pattern comprising a first section corresponding to the gate insulating layer and the active layer, and a second section which is outside the first section; the second photoresist material is removed in the first section;
depositing a conductive material layer on a side of the gate insulating layer, the active layer, and the second photoresist layer away from the base substrate; and
removing the second photoresist layer and the conductive material layer in the second section, thereby forming the first metal sub-layer, the second metal sub-layer, and the gate electrode.

15. The method of claim 14, wherein the step of removing the second photoresist layer and the conductive material layer in the second section is performed by a lift-off method using a lift-off solvent.

16. The method of claim 13, wherein the first photoresist layer comprises a silicone-based organic material having a structure of formula I:

(I)

n is a positive integer; X is oxygen or carbon; and each of $Y_1$ and $Y_2$ is selected from the group consisting of a hydrogen atom, an alkyl group, a hydroxyl group, an alkoxyl group, an aryl group, an acryloyl group, a glycidyl group, a vinyl group, a-$OR_1$ group, and a

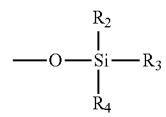

group; wherein $R_1$ is selected from the group consisting of a hydrogen atom, an alkyl group, and an aryl group, each of $R_2$, $R_3$, and $R_4$ is selected from the group consisting of a hydrogen atom, a hydroxyl group, an alkyl group, an aryl group, an alkoxyl group, a halogen atom, an acryloyl group, a glycidyl group, a vinyl group, a phenyl group, and a trialkylsiloxy group.

17. The method of claim 13, wherein the first photoresist layer comprises a silicone-based organic material having a structure of formula II:

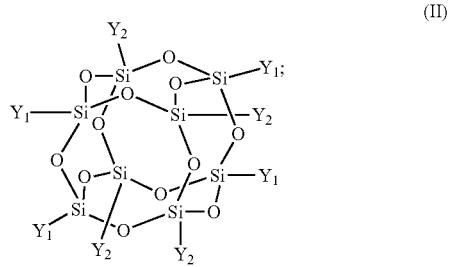

each of $Y_1$ and $Y_2$ is selected from the group consisting of a hydrogen atom, an alkyl group, a hydroxyl group, an alkoxyl group, an aryl group, an acryloyl group, a glycidyl group, a vinyl group, a-$OR_1$ group, and a

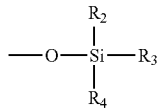

group; wherein $R_1$ is selected from the group consisting of a hydrogen atom, an alkyl group, and an aryl group, each of $R_2$, $R_3$, and $R_4$ is selected from the group consisting of a hydrogen atom, a hydroxyl group, an alkyl group, an aryl group, an alkoxyl group, a halogen atom, an acryloyl group, a glycidyl group, a vinyl group, a phenyl group, and a trialkylsiloxy group.

18. The method of claim 11, wherein the gate electrode and the active layer are formed so that the gate electrode has a fourth width along the direction from the source electrode contact region to the drain electrode contact region; and the fourth width is the same as the second width.

19. The method of claim 11, wherein the gate insulating layer is formed to have a first portion having a thickness which decreases along a first direction from the channel region towards the source electrode contact region, a second portion having a thickness which decreases along a second direction from the channel region towards the drain electrode contact region, and a third portion between the first portion and the second portion having a constant thickness.

20. The method of claim 11, wherein the gate insulating layer is formed to have an inverted trapezoidal shape; a short base of the inverted trapezoidal shape is on a side of the gate electrode layer closer to the channel region.

* * * * *